US011152651B2

(12) United States Patent
Gorlin et al.

(10) Patent No.: US 11,152,651 B2
(45) Date of Patent: Oct. 19, 2021

(54) METHOD FOR PREDICTING AN OPEN-CIRCUIT POTENTIAL CURVE AS A FUNCTION OF LITHIATION FOR A CLASS OF CATHODE MATERIALS

(71) Applicant: Robert Bosch GmbH, Stuttgart (DE)

(72) Inventors: Yelena Gorlin, Menlo Park, CA (US); Kevin Kimura, Ithaca, NY (US); Rebecca Wilhelm, Ergolding (DE); Soo Kim, Cambridge, MA (US); Camille Usubelli, San Jose, CA (US); Munir Besli, San Jose, CA (US); Joerg Ziegler, Rutesheim (DE); Reinhardt Klein, Mountain View, CA (US); Jake Christensen, Elk Grove, CA (US)

(73) Assignee: Robert Bosch GmbH, Stuttgart (DE)

( * ) Notice: Subject to any disclaimer, the term of this patent is extended or adjusted under 35 U.S.C. 154(b) by 140 days.

(21) Appl. No.: 16/697,388

(22) Filed: Nov. 27, 2019

(65) Prior Publication Data
US 2021/0159552 A1  May 27, 2021

(51) Int. Cl.
| | |
|---|---|
| *H01M 10/44* | (2006.01) |
| *H01M 10/42* | (2006.01) |
| *H02J 7/00* | (2006.01) |
| *H01M 10/0525* | (2010.01) |

(52) U.S. Cl.
CPC ....... *H01M 10/44* (2013.01); *H01M 10/0525* (2013.01); *H01M 10/425* (2013.01); *H02J 7/0047* (2013.01); *H02J 7/0068* (2013.01); *H01M 2010/4271* (2013.01)

(58) Field of Classification Search
CPC ............ H01M 10/44; H01M 10/0525; H01M 10/425; H01M 2010/4271; H02J 7/0047; H02J 7/0068; G01R 31/36; G01R 31/367
USPC ......................................................... 320/134
See application file for complete search history.

(56) References Cited

U.S. PATENT DOCUMENTS

| | | | |
|---|---|---|---|
| 8,188,715 B2 * | 5/2012 | Christensen .......... | H01M 10/48 320/118 |
| 2016/0245871 A1 * | 8/2016 | Joe ..................... | G01R 31/3842 |
| 2017/0194669 A1 | 7/2017 | Christensen et al. | |
| 2018/0097396 A1 * | 4/2018 | Qi ........................ | G01R 31/396 |

OTHER PUBLICATIONS

Chaturvedi, Nalin A., et al. "Algorithms for advanced battery-management systems." IEEE Control systems magazine 30.3 (2010): 49-68.

(Continued)

*Primary Examiner* — Nathaniel R Pelton
(74) *Attorney, Agent, or Firm* — Brooks Kushman P.C.

(57) ABSTRACT

A method for generating battery characteristics for a battery having a target composition includes identifying open-circuit potential (OCP) characteristics for two similar battery compositions having different proportions of elements. The OCP characteristics are converted to dQ/dV characteristics and linearly combined to derived a target dQ/dV characteristic. The target dQ/dV characteristic is integrated to derived a target OCP characteristic. A battery constructed of the target composition is operated according to the target OCP characteristic.

20 Claims, 7 Drawing Sheets

(56) References Cited

OTHER PUBLICATIONS

Weppner, W., and Robert A. Huggins. "Determination of the kinetic parameters of mixed-conducting electrodes and application to the system Li3Sb." Journal of the Electrochemical Society 124.10 (1977): 1569-1578.

Schmidt, Jan Philipp, et al. "Analysis and prediction of the open circuit potential of lithium-ion cells." Journal of Power Sources 239 (2013): 696-704.

Myung, Seung-Taek, et al. "Nickel-rich layered cathode materials for automotive lithium-ion batteries: achievements and perspectives." ACS Energy Letters 2.1 (2016): 196-223.

Li, Hongyang, et al. "Is Cobalt Needed in Ni-Rich Positive Electrode Materials for Lithium Ion Batteries?." Journal of the Electrochemical Society 166.4 (2019): A429-A439.

Lee, Kyung K., et al. "Characterization of LiNi0. 85Co0. 10M0. 05O2 (M= Al, Fe) as a cathode material for lithium secondary batteries." Journal of power sources 97 (2001): 308-312.

Li, Jing, et al. "Impact of the Synthesis Conditions on the Performance of LiNixCoyAlzO2 with High Ni and Low Co Content." Journal of the Electrochemical Society 165.14 (2018): A3544-A3557.

Zhang Ning, et al. "Structural, Electrochemical, and Thermal Properties of Nickel-Rich LiNi x Mn y Co z O2 Materials." Chemistry of Materials 30.24 (2018): 8852-8860.

\* cited by examiner

METHOD FOR PREDICTING AN OPEN-CIRCUIT POTENTIAL CURVE AS A FUNCTION OF LITHIATION FOR A CLASS OF CATHODE MATERIALS

TECHNICAL FIELD

This application generally relates to a method for predicting an open-circuit potential curve for a battery.

BACKGROUND

Lithium-ion batteries (LIB) have become the industry standard in both electric mobility and portable electronics applications. LIBs operate based on the movement of lithium ions between the negative electrode, known as anode, and the positive electrode, known as cathode. One of the inputs for predicting the charge/discharge behavior of the battery is a corresponding open circuit voltage (OCV) curve that defines the equilibrium voltage of the cell as a function of the state of charge. The OCV is unique to the composition of a particular battery due to its dependency on the thermodynamic properties of the active materials found in the anode and cathode electrodes, with each open circuit potential (OCP) curve of the individual materials directly influencing the shape of the overall OCV curve.

SUMMARY

A method includes identifying a set of predetermined elements, including a first element and a second element, for a cathode of a lithium-ion battery. The method includes identifying a first composition and a second composition of the set, the first composition and the second composition including different proportions of the first element and the second element. The method includes generating a first open-circuit potential (OCP) characteristic corresponding to the first composition and a second OCP characteristic corresponding to the second composition, wherein each of the OCP characteristics defines a voltage (V) as a function of capacity (Q) of the lithium-ion battery. The method includes converting the first OCP characteristic to a first dQ/dV characteristic and the second OCP characteristic to a second dQ/dV characteristic. The method includes identifying a third composition of the set having a predetermined proportion of the first element. The method includes generating a third dQ/dV characteristic for the third composition by summing a first proportion of the first dQ/dV characteristic and a second proportion of the second dQ/dV characteristic, wherein the first proportion is defined by the predetermined proportion, and the first proportion and the second proportion sum to one. The method includes integrating the third dQ/dV characteristic to generate a third OCP characteristic corresponding to the third composition and charging and discharging a battery comprised of the third composition using the third OCP characteristic.

The first composition may include a minimum proportion of the first element and a maximum proportion of the second element. The second composition may include a minimum proportion of the second element and a maximum proportion of the first element. The set of predetermined elements may include at least two different transition metal oxide components such that oxidation/reduction coulumbs in a lithiation/delithiation characteristic are proportional to a corresponding stoichiometric composition and a potential at which oxidation/reduction processes occur are approximately equal within a class of materials that include the at least two different transition metal oxide components. A range may be defined by a first difference between an upper proportion of the first element that is present in the second composition and a lower proportion of the first element that is present in the first composition and, the first proportion may be defined by dividing a second difference between the predetermined proportion and the lower proportion by the range. The first OCP characteristic and the second OCP characteristic may be approximated by averaging a lithiation characteristic and a delithiation characteristic corresponding to each of the first composition and the second composition. The set of predetermined elements may include Li, Ni, Co, M1, and O where M1 corresponds to a transition metal, and the first element is Ni, and the second element is Co. The set of predetermined elements may include Li, Ni, O and M1, where M1 is one of Al, Mn, or Mg, and the first element is Ni and the second element is M1. The set of predetermined elements may include Li, O, M1, and M2, wherein M1 and M2 are different transition metal oxide components.

A battery management system includes a memory for storing a plurality of characteristics corresponding to a plurality of compositions for a cathode of a battery. The battery management system includes a controller programmed to, responsive to receiving parameters for a target composition, (i) identify a class of compositions to which the target composition belongs, (ii) retrieve from the memory a first characteristic corresponding to a first composition and a second characteristic corresponding to a second composition such that the first composition and the second composition belong to the class, (iii) generate an open-circuit potential (OCP) characteristic for the target composition by summing a first proportion of the first characteristic and a second proportion of the second characteristic, wherein the first proportion is defined by a target proportion of a first element present in the target composition, and (iv) charging and discharging the battery according to the OCP characteristic.

The target proportion may be between a first edge proportion that defines a proportion of the first element in the first composition and a second edge proportion that defines the proportion of the first element in the second composition. The first composition and the second composition may include the first element and a second element, and the first composition may include a maximum proportion of the first element and a minimum proportion of the second element. The first characteristic may be a first composition OCP characteristic and the second characteristic may be a second composition OCP characteristic. The first characteristic may be a dQ/dV characteristic of the first composition and the second characteristic may be a dQ/dV characteristic of the second composition. Generating the OCP characteristic for the target composition may further include integrating a dQ/dV characteristic that results from summing a first proportion of the first characteristic and a second proportion of the second characteristic.

A method includes identifying a lower edge composition, including first and second transition metal components, for a cathode of a battery that defines a proportion of the first transition metal below which a 4.2V feature is not present. The method includes identifying an upper edge composition in which a proportion of the second transition metal is zero. The method includes generating a first open-circuit potential (OCP) characteristic for the lower edge composition and a second OCP characteristic for the upper edge composition. The method includes converting the first OCP characteristic to a first dQ/dV characteristic and the second OCP characteristic to a second dQ/dV characteristic. The method includes identifying a third composition having a predetermined proportion of the first transition metal. The method includes generating a third dQ/dV characteristic for the third composition by summing a first proportion of the first dQ/dV characteristic and a second proportion of the second dQ/dV characteristic, wherein the first proportion is defined by the predetermined proportion and the first proportion and the second proportion sum to one. The method includes integrating the third dQ/dV characteristic to generate a third OCP characteristic corresponding to the third composition, and outputting the third OCP characteristic to a battery management system for charging and discharging the battery comprised of the third composition.

A range may be defined by a difference between an upper proportion of the first transition metal that is present in the upper edge composition and a lower proportion of the first transition metal that is present in the lower edge composition and, the first proportion may be defined by dividing a difference between the predetermined proportion and the lower proportion by the range. The first and second transition metal components may be such that oxidation/reduction coulumbs in a lithiation/delithiation characteristic are proportional to a corresponding stoichiometric composition and a potential at which oxidation/reduction processes occur are approximately equal. The 4.2V feature may be defined as a dQ/dV peak that exceeds a predetermined threshold. The first transition metal may be nickel (Ni) and the second transition metal may be cobalt (Co).

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A lithium-ion battery (LIB) may be characterized by an open-circuit voltage (OCV) curve. The OCV curve may be unique to the composition of a particular battery and may provide one of the inputs for predicting the charge/discharge behavior of the battery. The OCV curve depends on the thermodynamic properties of the active materials found in the anode and cathode electrodes, with each open-circuit potential (OCP) curve of the individual materials influencing the shape of the overall OCV curve. Disclosed herein is a method for predicting the OCP curve for a class of cathode active materials. The method may be employed as part of a battery management system (BMS) that utilizes the OCV curve to provide estimates of battery parameters or as part of a battery design interface that uses a library of OCP properties of active materials or electrode blends. The battery parameters may include remaining battery capacity, power limits, state of health, and other characteristics.

Lithium-ion batteries have become the industry standard in both electric mobility and portable electronics applications. LIBs operate based on the movement of lithium ions between the negative electrode, known as anode, and the positive electrode, known as cathode. For example, during battery discharging, the cathode may receive lithium ions from the anode (lithiation) and during battery charging, the cathode may provide lithium ions to the anode (delithiation). Note that the methods described herein are also applicable to battery chemistries that use ions of Na, Mg, K, Ca, Al, Cl for charge transfer.

One of the inputs for predicting the charge/discharge behavior of the battery is an open-circuit voltage (OCV) curve that defines the equilibrium voltage of the battery cell as a function of the state of charge. The OCV is unique to the composition of a particular battery due to its dependency on the thermodynamic properties of the active materials found in the anode and cathode electrodes, with each open circuit potential (OCP) curve of the individual materials directly influencing the shape of the overall OCV curve. In order to specify the OCV curve with the highest accuracy, it is advantageous to identify the contributions of the individual active materials. However, this process may not always be possible due to lack of access to individual components (e.g., chemical composition) or due to a lengthy characterization time for obtaining each individual curve. Therefore, a method for predicting an OCP curve of an active material is desirable. Herein, a method is disclosed for predicting the OCP curve for a class of cathode active materials.

Existing technology uses characterization experiments to directly measure either the material OCPs or the OCV curve.

Several material OCPs may be combined to form a blended OCP for either a cathode or anode and the cathode and anode OCPs may be combined to form the OCV of a battery. However, current methods do not accurately predict (i.e., within +/−20 mV) the OCP curve for a particular material. The method disclosed herein allows the prediction of the OCP of a class of cathode materials without performing characterization experiments for each composition. The method disclosed herein may also be used to predict the OCP of "hypothetical" materials that have not yet been synthesized.

The methods disclosed herein may also be used in battery design to form a library of OCP curves for both known materials (whose OCPs could, in principle, be determined through characterization, a longer and more resource intensive process) and not yet synthesized "hypothetical" materials. The methods disclosed herein may also be used in battery design to predict the charge/discharge characteristics of a not yet assembled battery (comprising of at least one "hypothetical" material). The methods disclosed herein may also be used to identify cathode composition in an unopened battery using only electrical tests (without opening the battery) and provide a library of OCP curves. The OCP of identified material(s) could be implemented in the battery management system to improve the accuracy of the system.

The methods may be used for a certain class of materials in which the oxidation/reduction peaks of battery components comprising transition metal oxides are proportional to the stoichiometric ratio of the component in the material, with lithiation/delithiation of the transition metal oxide occurring at a similar potential (i.e., +/−20 mV or smaller).

An advantage of the disclosed approach is that a smaller subset of OCP functions may be programmed into a BMS or controller. The BMS/controller may then be used to operate a wide range of batteries that contain a wide range of materials of intermediate compositions. The compositions may be defined in part by an epsilon parameter that defines the relative percentages of the base compositions. The epsilon parameters, tailored to the intermediate compositions, may be provided to the BMS for a variety of compositions. Hence, the disclosed methods, when utilized in a BMS, saves time in programming when applying the BMS to a new battery for a new application. In particular, when subtle changes are made to material compositions within the same family during the battery development process, the epsilon values can be adjusted accordingly without reprogramming the BMS or performing new measurements for the new materials.

The OCP curve describes the equilibrium potential, a thermodynamic property, for a given state of lithium content inside an active battery material. The OCP curve may be represented as a Potential (V) versus a State of Lithiation (e.g., $Li_xAM$, where AM represents the active material and x is the lithium content that typically varies from zero to one) or as a Potential (V) versus capacity (mAh/g), where capacity is defined as x*theoretical capacity of the active material. The theoretical capacity depends on molecular weight of the active material and the ability of the active material to accommodate $Li^+$. As a result, each individual active material may define a unique OCP curve.

It is challenging to measure the OCP curve with precision and accuracy due to kinetic hindrances that may cause difficulties in isolating the thermodynamic properties. The conventional method of OCP curve measurement is to perform intermittent rests during both the lithiation and delithiation cycles of a battery half-cell (active material coated onto a current collector vs. lithium metal electrode), and then connect the measurements that are taken at the rest points. Unfortunately, this process can take several weeks to complete and may not eliminate all the kinetic components to produce the target thermodynamic property. As such, it is desirable to develop a method to predict the OCP curve of materials without having to perform additional characterization.

Disclosed herein is a method for predicting the OCP curve for a class of cathode materials. The method includes a number of steps that are described herein. The validity of the method is established using examples of two cathode families. The method, however, may be extended to all cathode families in which the coulombic charge of the lithiation/delithiation features of the components is proportional to the stoichiometric ratio of the electrochemically active components, with lithiation/delithiation of the component occurring at a similar potential (i.e., +/−20 mV or smaller).

In a first step of the method, edge compositions may be identified in a cathode family for which the OCP predictions will be made. For the following examples that focus on cathode families rich in nickel (Ni) content, the lithiation/delithiation features in the OCP curve are shown to be proportional to the stoichiometric ratio of Ni in the material. One of the features that is characteristic of Ni-rich cathode materials occurs at approximately 4.2V vs. $Li/Li^+$ (subsequently, in the text and in the figures, "V vs. $Li/Li^+$" may be referred to as simply "V") and disappears if the Ni content reduces below a certain value. The cathode composition at which the ~4.2V feature can be predicted to disappear may be defined as the lower edge composition. The higher edge composition may be defined by the reduction to zero of the composition of one of the other transition metals present in the identified cathode family (disappearance of that component). In the examples, cobalt (Co) is the transition metal that varies along with Ni and the composition of cobalt can be reduced to zero. In other cathode families, however, a different transition metal oxide or component, not necessarily Co, may be reduced either to zero or to a different value.

In a second step of the method, the OCP curves of the two edge compositions may be obtained. The OCP curves may be taken from literature or directly characterized using known methods. If the OCP curve of the edge composition is not yet known, then the closest known composition within the range of the class of materials in question may be used.

In a third step of the method, the OCP curves of the two edge compositions (or the OCP curves of the closest available composition with the range of the class of materials) are used to predict the OCP curves of the intermediate compositions. The intermediate compositions may be generated by linearly combining the inverse derivative (dQ/dV vs. V curve) of the OCP curves expressed as Potential (V) versus Capacity (Q, mAh/g) of the edge compositions (or substitutes) in the appropriate stoichiometric ratios, $\varepsilon$ and $(1-\varepsilon)$. The intermediate composition may be characterized by the following equation:

$$\frac{dQ_{EdgeComposition1}}{dV}\varepsilon + \frac{dQ_{EdgeComposition2}}{dV}(1-\varepsilon) = \frac{dQ_{IntermediateComposition}}{dV} \quad (1)$$

Alternatively, the integral of this equation may be used to obtain $Q_{Intermediate}(V)$ when a reference potential is provided for which $Q_1$ and $Q_2$ are defined. More generally, when there are several "basis function" materials that define a composition range, the following equation may be used:

$$\Sigma Q_i(V) * \varepsilon_i = Q_{Intermediate}(UV), \text{where } \Sigma \varepsilon_i = 1 \quad (2)$$

The resulting dQ/dV vs. V curve of an intermediate composition may first be integrated and then the reciprocal of the result may be taken to produce the corresponding OCP curve in the form of Potential (V) vs. Capacity (mAh/g). The same protocol may be used for obtaining OCPs of mixtures of materials and for individual materials.

The first example family that is used to establish the validity of the method is $LiNi_{0.95-\varepsilon z}Co_{\varepsilon x}Al_{0.05}O_2$. In this family, Ni is the component whose stoichiometric contribution decreases linearly as the charge associated with electrochemical features also decreases, while Co is the component whose stoichiometric contribution is proportionally increased. The stoichiometric contribution of the third component, aluminum (Al), is held constant at 0.05.

The two possible edge compositions that may be used to demonstrate the validity of the proposed method are $LiNi_{0.95}Al_{0.05}O_2$ (with Co component reduced to zero) and $LiNi_{0.80}Co_{0.15}Al_{0.05}O_2$, the standard nickel cobalt aluminum oxide (NCA) cathode. Although $LiNi_{0.80}Co_{0.15}Al_{0.05}O_2$ is a material from the Ni-rich NCA family with the smallest reported charge associated with the feature at ~4.2 V (when this feature is present), it is not considered as a true edge composition, because there should exist a composition with a lower Ni content that is part of this class of materials. This composition would lack the feature at ~4.2 V and have the highest possible Ni content out of all NCA materials that lack this feature. Based on the charge associated with the feature at ~4.2 V for $LiNi_{0.80}Co_{0.15}Al_{0.05}O_2$ and $LiNi_{0.95}Al_{0.05}O_2$, a lower Ni content is extrapolated to predict that the lower edge composition should be $LiNi_{0.78}Co_{0.17}Al_{0.05}O_2$. However, as stated above, $LiNi_{0.80}Co_{0.15}Al_{0.05}O_2$ may be used as a substitute composition for the lower edge OCP because the OCP data for the $LiNi_{0.78}C_{0.17}Al_{0.05}O_2$ material is not known.

Figure 1:
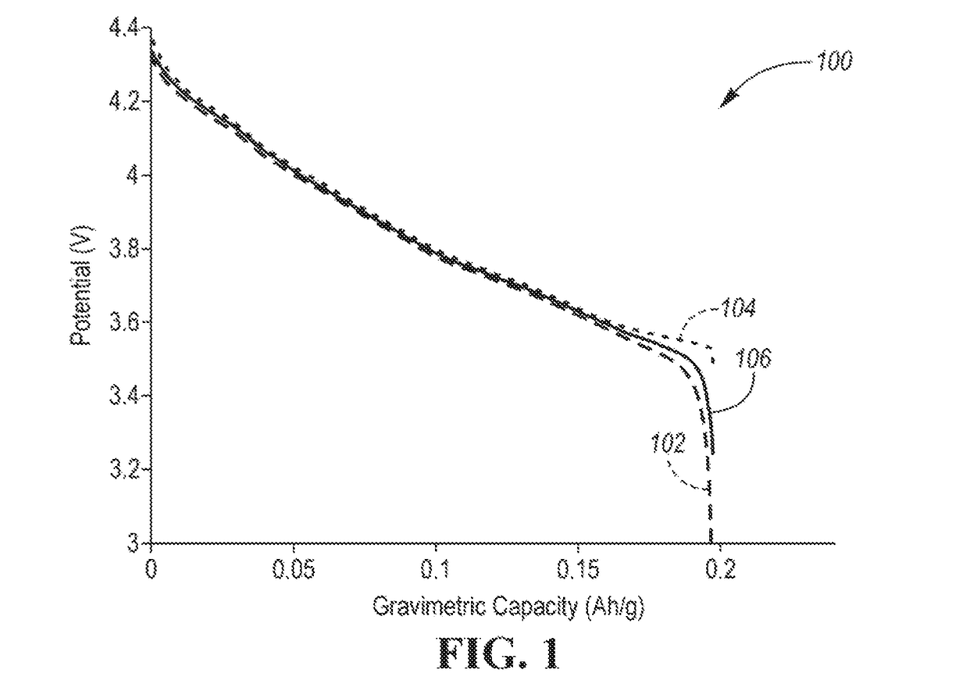
FIG. 1 depicts example voltage/capacity characteristics for a $LiNi_{0.80}Co_{0.15}Al_{0.05}O_2$ battery cell.

To demonstrate the validity of the method, one may obtain OCP curves for $LiNi_{0.80}Co_{0.15}Al_{0.05}O_2$ and $LiNi_{0.95}Al_{0.05}O_2$ materials. The OCP of $LiNi_{0.80}Co_{0.15}Al_{0.05}O_2$ may be characterized by using a slow cycling rate with a current of 4.7 $mA/g_{active\_material}$ to lithiate and delithiate the material in a coin cell that uses lithium metal foil as both counter and reference electrodes. From the data, the OCP curve may be approximated by taking the average of the lithiation and delithiation branches, as shown in FIG. 1. FIG. 1 depicts an OCP graph 100 that shows the potential (V) versus capacity (Ah/g) characteristic for the $LiNi_{0.80}Co_{0.15}Al_{0.05}O_2$ battery cell. A lithiation curve 102 shows the performance of the battery cell during the lithiation cycle. A delithiation curve 104 shows the performance during the delithiation cycle. An average curve 106 shows the average of the lithiation curve 102 and the delithiation curve 104.

Figure 2:
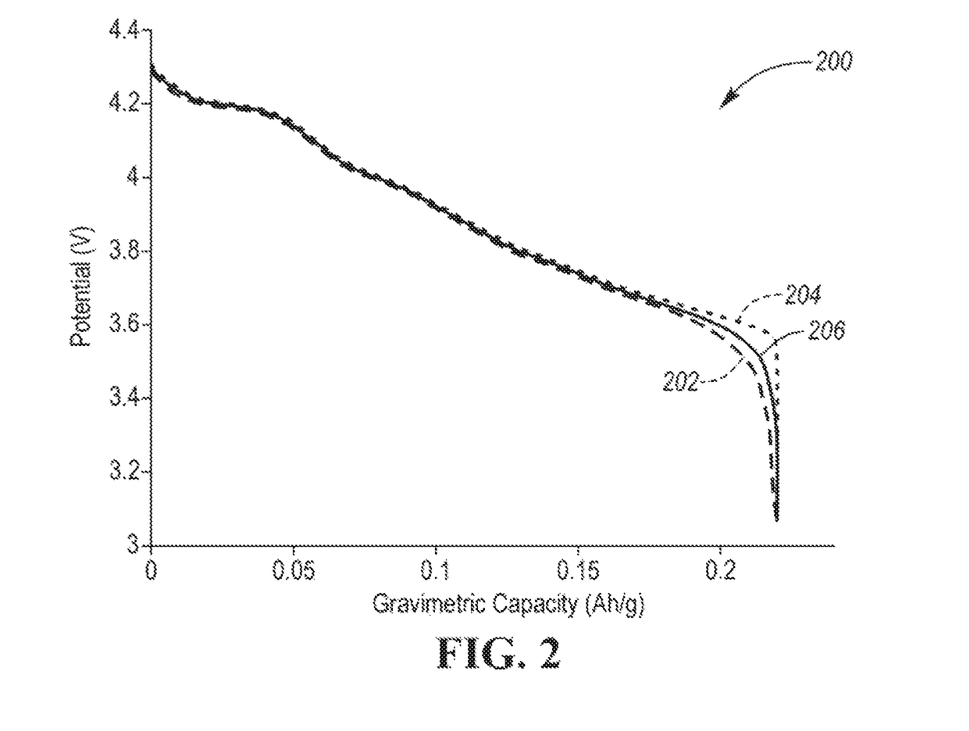
FIG. 2 depicts example voltage/capacity characteristics for a $LiNi_{0.95}Al_{0.05}O_2$ battery.

The OCP curve of $LiNi_{0.95}Al_{0.05}O_2$ is based on data available in literature. The data includes lithiation and delithiation curves obtained at a slow cycling rate of 10 $mA/g_{active\_material}$. To convert the published data to an OCP curve, the average of the lithiation and delithiation curves may be computed. Both the literature data and the calculated average are shown in FIG. 2. FIG. 2 depicts an OCP graph 200 that shows the potential (V) versus capacity (Ah/g) characteristic of the $LiNi_{0.95}Al_{0.05}O_2$ battery. A lithiation curve 202 shows the performance of the battery during the lithiation cycle. A delithiation curve 204 shows the performance during the delithiation cycle. An average curve 206 shows the average of the lithiation curve 202 and the delithiation curve 204.

Figure 3:
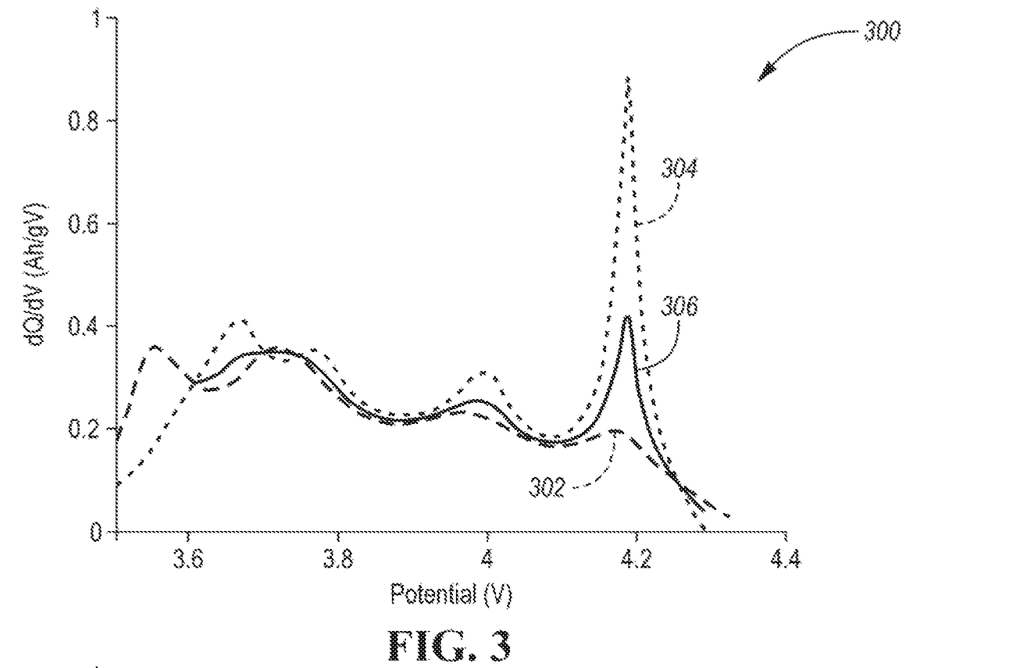
FIG. 3 depicts an example dQ/dV characteristics for a $LiNi_{0.80}Co_{0.15}Al_{0.05}O_2$ battery, a $LiNi_{0.95}Al_{0.05}O_2$ battery, and a first material combination.
Figure 4:
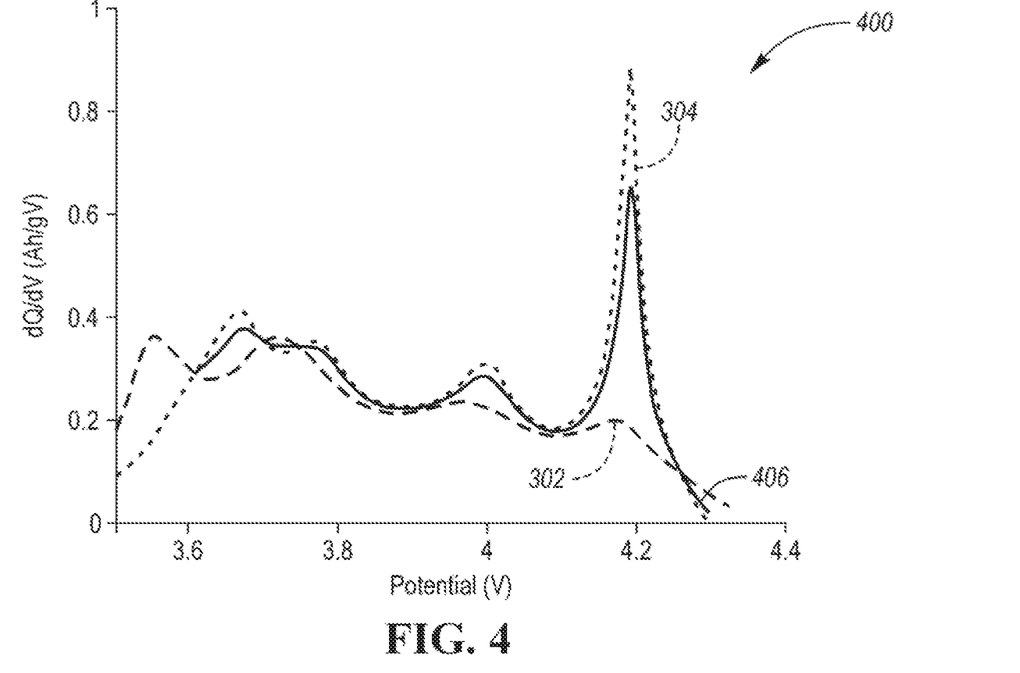
FIG. 4 depicts an example dQ/dV characteristic for a $LiNi_{0.80}Co_{0.15}Al_{0.05}O_2$ battery, a $LiNi_{0.95}Al_{0.05}O_2$ battery, and a second material combination.

To apply the formula in equation (1), the derivative of the two OCP curves may be computed. The reciprocal of the derivative produces dQ/dV vs. V curve shown in FIG. 3 and FIG. 4. FIG. 3 shows a graph 300 of the dQ/dV vs. V characteristic for a first material combination. FIG. 4 shows a graph 400 of the dQ/dV vs. V characteristic for a second material combination. A first composition curve 302 shows the dQ/dV v. V characteristic for the $LiNi_{0.80}Co_{0.15}Al_{0.05}O_2$ composition. A second composition curve 304 show the dQ/dV v. V characteristic for the $LiNi_{0.95}Al_{0.05}O_2$ composition. Note that FIG. 3 and FIG. 4 show a 4.2V feature as a peak in the dQ/dV curve at around 4.2V. The 4.2V feature may be considered to be present when the dQ/dV value at the peak exceeds a predetermined threshold. The 4.2V feature may not be present when there is no pronounced peak in the dQ/dV curve around 4.2V. That is, the dQ/dV curve is flat around 4.2V. FIG. 3 shows a first performance curve 306 for the composition created using an a value of 0.667. FIG. 4 shows a second performance curve 406 for the composition created using an c value of 0.333.

The first composition curve 302 and the second composition curve 304 may be used to generate dQ/dV vs. V representations for $LiNi_{0.85}Co_{0.15}Al_{0.05}O_2$ ($\varepsilon$ value of 0.667) and $LiNi_{0.90}Co_{0.05}Al_{0.05}O_2$ ($\varepsilon$ value of 0.333) materials according to the following equation:

$$\frac{dQ_{Ni_{0.8}Co_{0.15}Al_{0.05}}}{dU}\varepsilon + \frac{dQ_{Ni_{0.95}Al_{0.05}}}{dU}(1-\varepsilon) = \quad (3)$$

$$\frac{dQ_{Ni_{0.95-0.15\varepsilon}Co_{0.15\varepsilon}Al_{0.05}}}{dU}$$

In order to verify the accuracy of the method, it is helpful if the target compositions have been previously characterized. The dQ/dV vs. V representations for $LiNi_{0.85}Co_{0.15}Al_{0.05}O_2$ and $LiNi_{0.90}Co_{0.05}Al_{0.05}O_2$ materials have been previously synthesized and characterized in the literature. As with the $LiNi_{0.95}Al_{0.05}O_2$ material, the lithiation and delithiation curves are obtained at a slow cycling rate of 10 $mA/g_{active\_material}$. As such, an average curve may be developed and the corresponding dQ/dV vs. V curves may be derived as described herein.

Figure 5:
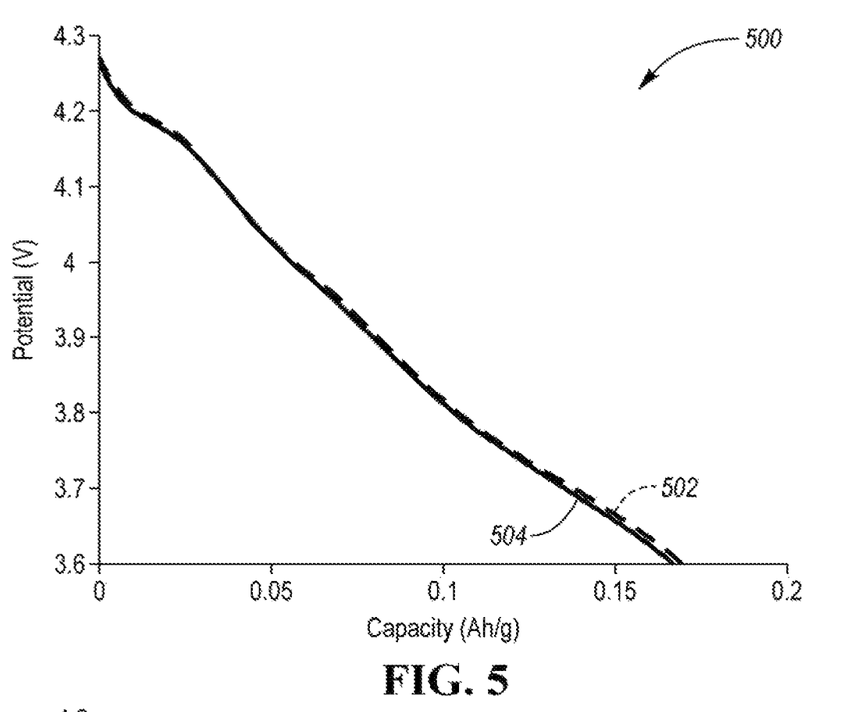
FIG. 5 depicts a comparison of a reference curve to an estimated curve for a $LiNi_{0.85}Co_{0.15}Al_{0.5}O_2$ composition.
Figure 6:
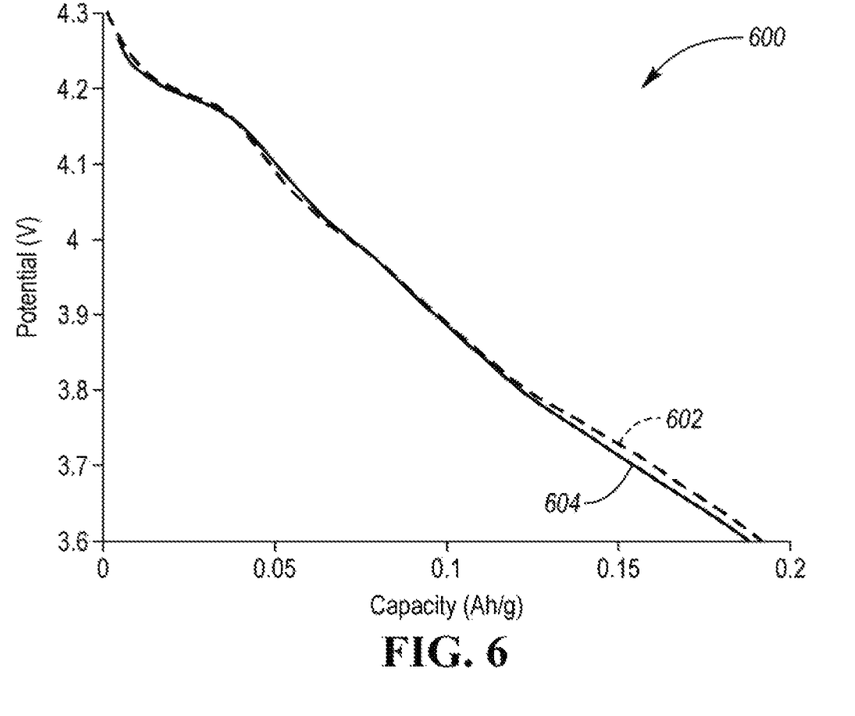
FIG. 6 depicts a comparison of a reference characteristic to an estimated characteristic for a $LiNi_{0.90}Co_{0.05}Al_{0.05}O_2$ composition.

To convert the published data to an OCP curve, the average of the lithiation and delithiation curves may be computed. The resulting OCP curves are plotted in FIG. 5 and FIG. 6. FIG. 5 depicts a graph 500 comparing the reference curve 502 to the estimated curve 504 for the $LiNi_{0.85}Co_{0.15}Al_{0.05}O_2$ (value of 0.667) composition. The reference curve 502 may be derived from the literature as described, and the estimated curve 504 is computed as described by equation (3) with an c value of 0.667. The reference curve 502 may represent the average of the corresponding lithiation and delithiation curves. FIG. 6 depicts a graph 600 comparing a reference curve 602 to the estimated curve 604 for the $LiNi_{0.90}Co_{0.05}Al_{0.05}O_2$ ($\varepsilon$ value of 0.333) composition. The reference curve 602 may be derived from the literature as described, and the estimated curve 604 is computed as described by equation (3) with an $\varepsilon$ value of 0.333. The reference curve 602 may represent the average of the corresponding lithiation and delithiation curves.

FIG. 5 and FIG. 6 compare the curves generated by the predicted dQ/dV vs. V curves for $LiNi_{0.85}Co_{0.15}Al_{0.05}O_2$ ($\varepsilon$ value of 0.667) and LiNi$_{0.90}$Co$_{0.05}$Al$_{0.05}$O$_2$ (ε value of 0.333) by integrating the dQ/dV curves, and then taking the reciprocal of the result to produce OCP curves in the form of a Potential (V) vs. Capacity (mAh/g) characteristic. The close agreement (deviations vary between 0.1-15 mV) between the measured and predicted OCPs provides the first example of the validation of the method disclosed herein. Note that while depicted as curves, the OCPs and dQ/dV characteristics may also be stored as table values in a memory device.

The second example family that may be used to establish the validity of the method is LiNi$_{0.80-εx}$Co$_{εx}$Mn$_{0.20}$O$_2$. In this family, Ni is again the component whose stoichiometric contribution decreases linearly as the charge associated with electrochemical features also decreases, while Co is the component whose stoichiometric contribution is proportionally increased. The stoichiometric contribution of the third component, manganese (Mn), is held constant at 0.20.

Figure 7:
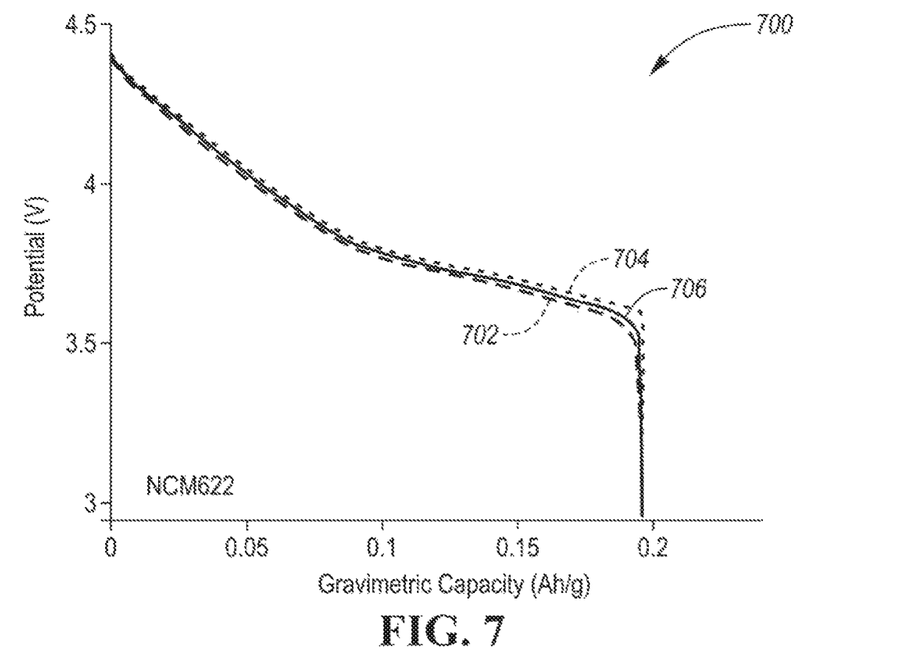
FIG. 7 depicts example voltage/capacity characteristics for a NCM622 battery cell.
Figure 8:
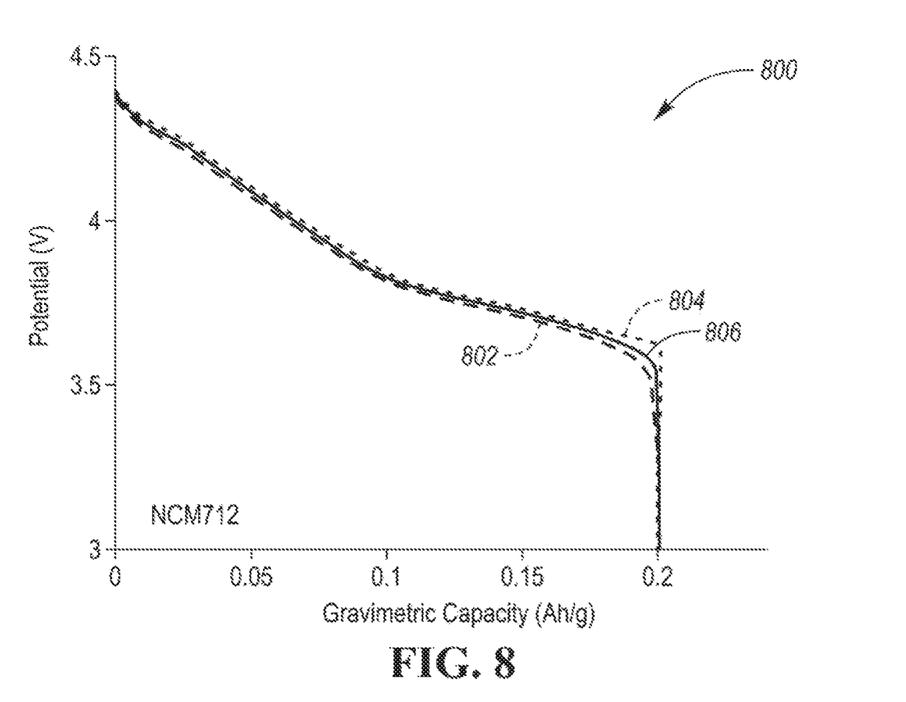
FIG. 8 depicts example voltage/capacity characteristics for a NCM712 battery cell.
Figure 9:
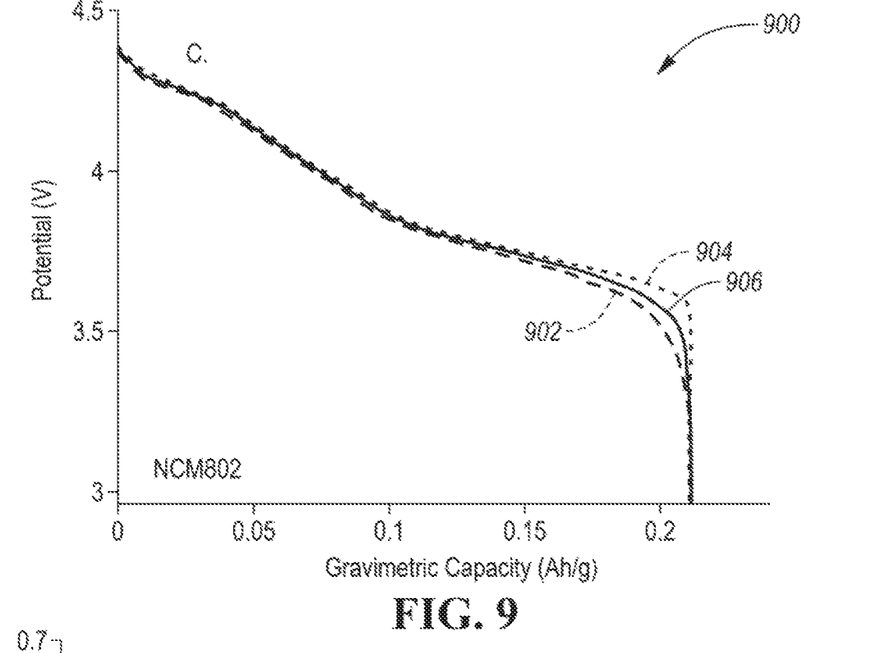
FIG. 9 depicts example voltage/capacity characteristics for a NCM802 battery cell.

The two edge compositions that may be used to demonstrate the validity of the proposed method are LiNi$_{0.80}$Mn$_{0.20}$O$_2$ (with Co component reduced to zero) and LiNi$_{0.60}$Co$_{0.20}$Mn$_{0.20}$O$_2$. The OCP curves of both LiNi$_{0.80}$Mn$_{0.20}$O$_2$ and LiNi$_{0.60}$Co$_{0.20}$Mn$_{0.20}$O$_2$ are based on data available in literature. The data includes lithiation and delithiation curves that are obtained at a slow cycling rate of 10 mA/g$_{active\_material}$. To convert the published data to an OCP curve, the average of the lithiation and delithiation curves may be computed. Both the literature data and the calculated average, representing the OCP curve, are shown in FIG. 7, FIG. 8, and FIG. 9. FIG. 7 depicts a first OCP graph 700 including a lithiation characteristic 702, a delithiation characteristic 704, and an average characteristic 706 for a NCM622 battery cell having a Ni:C:Mn composition ratio of 6:2:2. FIG. 8 depicts a second OCP graph 800 including a lithiation characteristic 802, a delithiation characteristic 804, and an average characteristic 806 for a NCM712 battery cell having a Ni:Co:Mn composition ratio of 7:1:2. FIG. 9 depicts a third OCP graph 900 including a lithiation characteristic 902, a delithiation characteristic 904, and an average characteristic 906 for a NCM802 battery cell having a Ni:Co:Mn composition ratio of 8:0:2.

Figure 10:
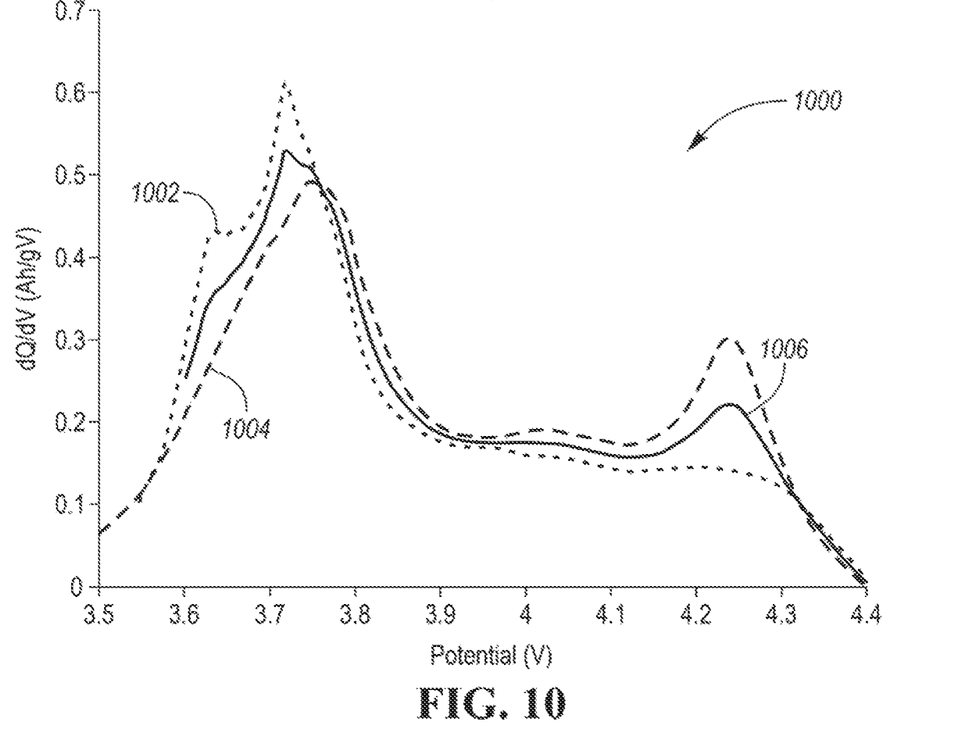
FIG. 10 depicts an example dQ/dV characteristic for a $LiNi_{0.80}Mn_{0.20}O_2$ battery, a $LiNi_{0.60}Co_{0.20}Mn_{0.20}O_2$ battery, and a material combination.

As in the first example, the derivative may be taken of two of the OCP characteristics and the reciprocal of the derivative produces a graph 1000 of dQ/dV vs. V curves as shown in FIG. 10. FIG. 10 depicts a NCM622 dQ/dV characteristic 1002 for the NCM622 composition and a NCM802 dQ/dV characteristic 1004 for the NCM802 composition. The NCM622 characteristic 1002 and the NCM802 characteristic 1004 and equation (1) may be used to construct a NCM712 dQ/dV characteristic 1006 for the LiNi$_{0.70}$Co$_{0.10}$Mn$_{0.20}$O$_2$ (NCM712) material that has an intermediate composition between LiNi$_{0.80}$Mn$_{0.20}$O$_2$ and LiNi$_{0.60}$Co$_{0.20}$Mn$_{0.20}$O$_2$ (ε=1−ε=0.5, as shown in equation (4)). The predicted dQ/dV vs. V characteristic 1006 of LiNi$_{0.70}$Co$_{0.10}$Mn$_{0.20}$O$_2$ material may then be integrated and the reciprocal of the result may be used to produce an OCP curve in the form of Potential (V) vs Capacity (mAh/g).

$$\frac{dQ_{Ni_{0.60}Co_{0.20}Mn_{0.20}}}{dU}\varepsilon + \frac{dQ_{Ni_{0.80}Mn_{0.20}}}{dU}(1-\varepsilon) = \frac{dQ_{Ni_{0.80-0.20\varepsilon}Co_{0.20\varepsilon}Mn_{0.20}}}{dU} \quad (4)$$

Figure 11:
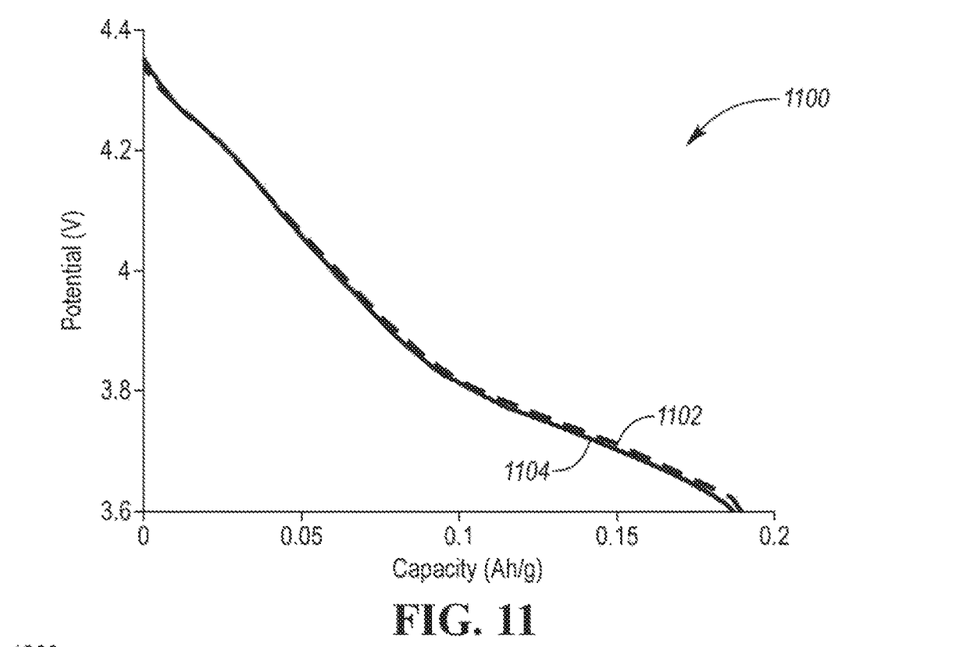
FIG. 11 depicts a comparison of a reference characteristic to an estimated characteristic for a $LiNi_{0.70}Co_{0.10}Mn_{0.20}O_2$ composition.

The LiNi$_{0.70}$Co$_{0.10}$Mn$_{0.20}$O$_2$ material has been previously characterized in literature as shown in FIG. 8. The data includes lithiation and delithiation curves obtained at a slow cycling rate of 10 mA/g$_{active\_material}$. This data may be converted to an OCP curve, by taking the average of the lithiation and delithiation curves. FIG. 11 depicts a comparison graph 1100 that directly compares a literature-derived OCP characteristic 1102 that is derived from literature to a predicted OCP characteristic 1104 that is predicted using the disclosed method. The close agreement (deviations vary between 0.1-15 mV) between the measured characteristic 1102 and predicted OCP characteristic 1104 provides a second example of the validation of the method disclosed in this invention.

Although the two examples are provided for a class of cathodes with a general formula of LiNi$_{y-εx}$Co$_{εx}$M$_z$O$_2$, in which z is constant and M corresponds to Al or Mn, it has been reported that electrochemical properties of LiNi$_{0.95-εx}$M$_{0.05+εx}$O$_2$, where M=Al, Mn, and Mg and M≠Co are analogous to that of LiNi$_{0.95-x}$Co$_x$Al$_{0.05}$O$_2$ family, making the extension of the method to the LiNi$_{0.95-εx}$M$_{0.05+εx}$O$_2$ family possible. The method can further be extended to all classes of cathode materials that contain at least two different transition metal oxide components, LiM1$_x$M2$_y$O$_2$, with the following two general properties: (a) the oxidation/reduction coulombs in the lithiation/delithiation curve is proportional to their stoichiometric composition of the cathode and, (b) the potential at which the oxidation/reduction processes occur are approximately the same (i.e., +/−20 mV or smaller) within that class of materials.

The above-described method is validated using a Ni-rich NCA cathode family of LiNi$_{0.95-0.15ε}$Co$_{0.15ε}$Al$_{0.05}$O$_2$ and 0<ε<1. The method is further confirmed using a Ni-rich NMC cathode family of LiNi$_{0.80-0.20ε}$Co$_{0.20ε}$Mn$_{0.20}$O$_2$ and 0<ε<1. The results show that the method can accurately predict the OCP characteristic for different compositions without having to perform extensive characterization tests.

The method may also be extended to a general class of cathode families having a general formula of LiNi$_{x-yε}$Co$_{yε}$M$_z$O$_2$, in which z is a constant and M may correspond to a variety of transition metals including, but not limited to, Mg, Fe, Ti, Cr, and others. The method may also be extended to a general class of cathode families with electrochemical properties analogous to that of LiNi$_{x-yε}$Co$_{yε}$M$_z$O$_2$ such as LiNi$_{0.95-x}$M$_{0.05+z}$O$_2$, where M=Al, Mn, and Mg, but M≠Co.

In addition, the method may be extended to all classes of cathode materials that contain at least two different transition metal oxide components, M$_I$ and M$_{II}$ in LiM$_{Ix}$M$_{IIy}$O$_2$, that satisfy the following two general properties: (a) the oxidation/reduction coulombs in the lithiation/delithiation curve are proportional to their stoichiometric composition of the cathode and, (b) the potential at which the oxidation/reduction processes occur are approximately the same (i.e., +/−20 mV or smaller) within that class of materials.

The method may be extended to Li-rich cathode materials having a general formula Li$_{1+x}$M$_{1-x}$O$_2$, where more than one Li unit is present per transition metal, so that anion redox process may occur (O$^{2-}$ to O$^{1-}$). Some examples include but are not limited to: Li$_{10.5}$(Ni$_a$Co$_b$Mn$_c$)$_{0.95}$O$_2$, Li$_{1.1}$(Ni$_a$Co$_b$Mn$_c$)$_{0.9}$O$_2$, Li$_{1.15}$(Ni$_a$Co$_b$Mn$_c$)$_{0.85}$O$_2$, Li$_{1.2}$(Ni$_a$Co$_b$Mn$_c$)$_{0.8}$O$_2$, Li$_{1.25}$(Ni$_a$Co$_b$Mn$_c$)$_{0.75}$O$_2$, Li$_{1.3}$(Ni$_a$Co$_b$Mn$_c$)$_{0.7}$O$_2$, and Li{Li$_{1/3}$(Ni$_a$Co$_b$Mn$_c$)$_{2/3}$}O$_2$, where the sum of a, b, and c is one. In some compositions, another dopant acting as a transition metal such as M'=Ti, V, Cr, Mn, Fe, Mo, Ru, or Ir may be present instead of Ni and Co. Other types of stabilizing element such as M''=Al, Si, Sc, Zn, Ga, Ge, Y, Zr, Nb, Sn, and W may also be substituted for Mn.

The method may also extend to Li-rich cathode materials having a general formula of $Li_2MO_3$, where M=Si, Ti, V, Cr, Mn, Fe, Co, Ni, Ge, Zr, Mo, Ru, Rh, Pd, Sn, Hf, W, Os, Ir, Pt or Pb. Additional compositions may include $Li_2M_IM_{II}O_3$, where $M_I$ is a redox metal that can exceed the oxidation state of 4+ such as V, Cr, Ru, Rh, Pd, W, Os, Ir, or Pt and Mn is a stabilizing agent where the oxidation state beyond 4+ is difficult to achieve such as Ti, Mn, Fe, Co, Ni, Ge, Zr, Sn, or Pb (e.g., $Li_2Ru_{0.75}Sn_{0.25}O_3$, $Li_2Ru_{0.75}Ti_{0.25}O_3$, etc.). In some compositions, oxygen may be doped/substituted with anion such as F or Cl (e.g., $Li_2Mn_{2/3}Nb_{1/3}O_2F$).

The method may extend to other Li-excess materials such as $Li_{1.211}Mo_{0.467}Cr_{0.3}O_2$, $Li_{1.17}Ni_{0.33}Ti_{0.42}Mo_{0.08}O_2$, or, $Li_{1.25}Mn_{0.5}Nb_{0.25}O_2$. The method may extend to olivine $LiMPO_4$ (where M=Fe, Ni, Co, and Mn) and spinel-type $LiMn_2O_4$ and $LiNi_{0.5}Mn_{1.5}O_4$, as well as mixed spinel compounds including $Li_4Ti_5O_2$ and $Li_4Mn_5O_{12}$.

The current method can be used for Li-ion secondary batteries as well as for Na, Mg, K, Ca, Al, Cl-ion secondary batteries. The method may be applied to any arbitrary hypothetical set of "basis" materials that define a particular composition range for which there is sufficient experimental or theoretical evidence to suggest that intermediate material OCP functions follow equation (1) or modifications thereof (e.g., integral form).

A battery management system may be programmed to include a plurality of open-circuit potential functions, $Q_i(U)$, for edge compositions that define a family of materials, wherein these functions have been measured through experiments and/or predicted through computations. The BMS may define factors ($\varepsilon_i$ values) that define the capacity fraction of each edge composition that comprise the material of intermediate composition that is used in the battery.

The BMS may include logic that sums up the $Q_i(V)$ functions (or their derivatives, $dQ_i/dV$) weighted by the e, values to obtain the relationship $Q(V)$ for the intermediate composition. $Q_{i0}(V_O)$ capacity values may be predefined for each edge composition for a particular reference equilibrium voltage $V_O$. The BMS may include a function that inverts the relationship $Q(V)$ to obtain $V(Q)$ (e.g., through linear interpolation between $QA(VA)$ and $QB(VB)$).

The BMS may include logic that uses estimated or measured values of the cell equilibrium potential to estimate the open-circuit potential, V, of the target material of the intermediate composition. The BMS may be programmed to estimate the target material's capacity or state of charge from the derived equation $Q(V)$ for that material. The BMS may include logic that estimates the amount of remaining cyclable extrinsic capacity of the target active material, additional active materials in the cell, and amount of cyclable lithium. For example, the BMS may implement strategies as disclosed in U.S. Pat. No. 8,188,715 and U.S. Publication 2017/0194669, which are hereby incorporated in their entirety by reference herein.

Figure 12:
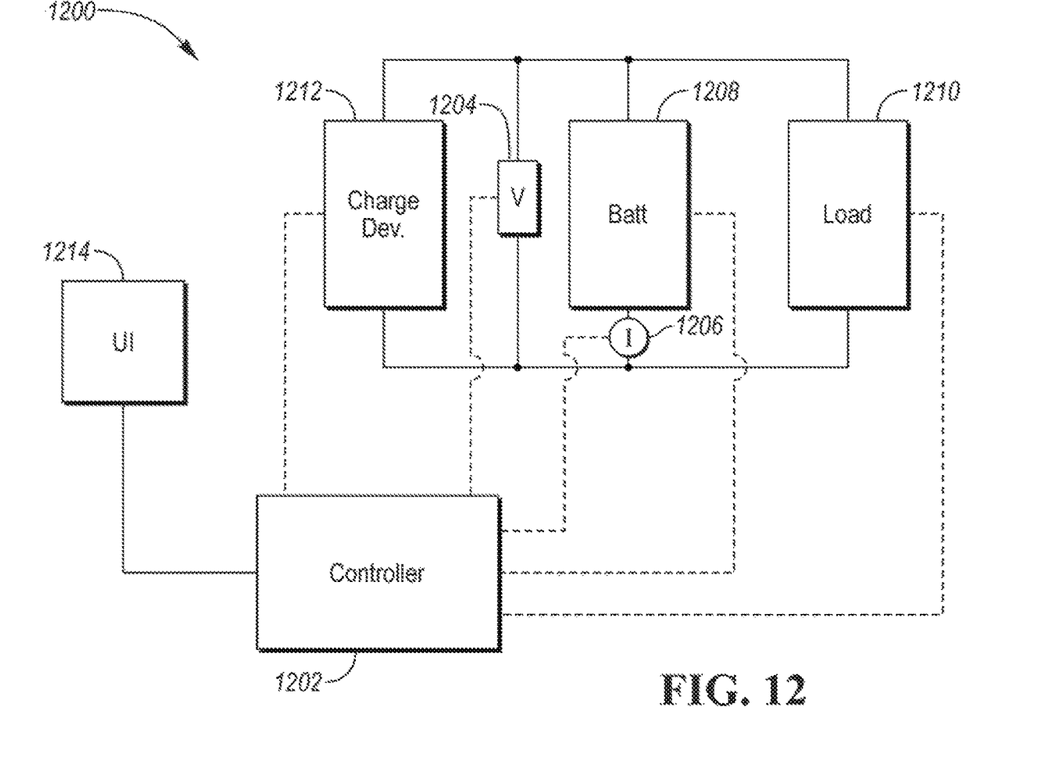
FIG. 12 depicts a possible configuration for a battery management system.

FIG. 12 depicts a diagram for a battery management system 1200. The BMS 1200 may include a battery 1208 that is electrically connected to an electrical load 1210 and a charging device 1212. The charging device 1212 may be an external device (e.g., external charger) and/or may be an internal device (e.g., generator). The battery management system 1200 may include a controller 1202. The controller 1202 may include a processing unit for executing instructions. The controller 1202 may include volatile and non-volatile memory for storing programs and data. The memory may include any non-transitory memory (e.g., a non-transitory computer-readable medium), volatile memory, non-volatile memory, magnetic memory, optical memory, random access memory (RAM), read-only memory (ROM), non-volatile RAM (NVRAM), electrically-erasable programmable ROM (EEPROM), flash memory, or any other digital or analog media. The BMS 1200 may include one or more voltage sensing units 1204 that are configured to measure voltages within and/or across terminals of the battery 1208. The BMS 1200 and/or controller 1202 may include circuitry to isolate and scale the voltage. The BMS 1200 may include a current sensor 1206 that is configured to measure current flowing through the battery 1208. The BMS 1200 may be coupled to a user interface 1214 that is configured to permit user entry of various parameters. For example, the user may enter a battery type via the user interface 1214. The battery type may include information regarding the battery chemistry. The battery type may allow the controller 1202 to select the corresponding battery characteristics. If the battery type has corresponding characteristics stored in memory, the controller 1202 may retrieve and use the stored characteristics. If the battery type indicates a new composition, the controller 1202 may retrieve corresponding edge compositions and execute the above-described method to generate a new battery characteristic. The new battery characteristic may be stored in memory for later use. In some configurations, the battery 1208 may be encoded with the battery type and may be communicated to the controller 1202. The battery type may indicate the general chemical composition and the $\varepsilon$ value for the battery 1208.

The controller 1202 may be programmed to operate the battery 1208 within preferred operating ranges. The controller 1202 may operate the load 1210 and the charging device 1212 to cause the battery 1208 to operate within the preferred operating ranges. The controller 1202 may be programmed to determined a state of charge of the battery 1208. For example, based on voltage and current measurements, the controller 1202 may implement algorithms to compute the state of charge. The computation of the state of charge may utilize the stored voltage/capacity characteristic for the battery 1208. As an example, after a sufficient rest period, a measurement of the terminal voltage of the battery 1208 is related to the capacity and state of charge. The open-circuit voltage may be used to estimate the state of charge by determining the capacity value corresponding to the measured open-circuit voltage. The controller 1202 may be programmed to charge and discharge the battery 1208 based on the state of charge. For example, if the state of charge falls below a threshold, the controller 1202 may request the charging device 1212 to charge the battery 1208.

Figure 13:
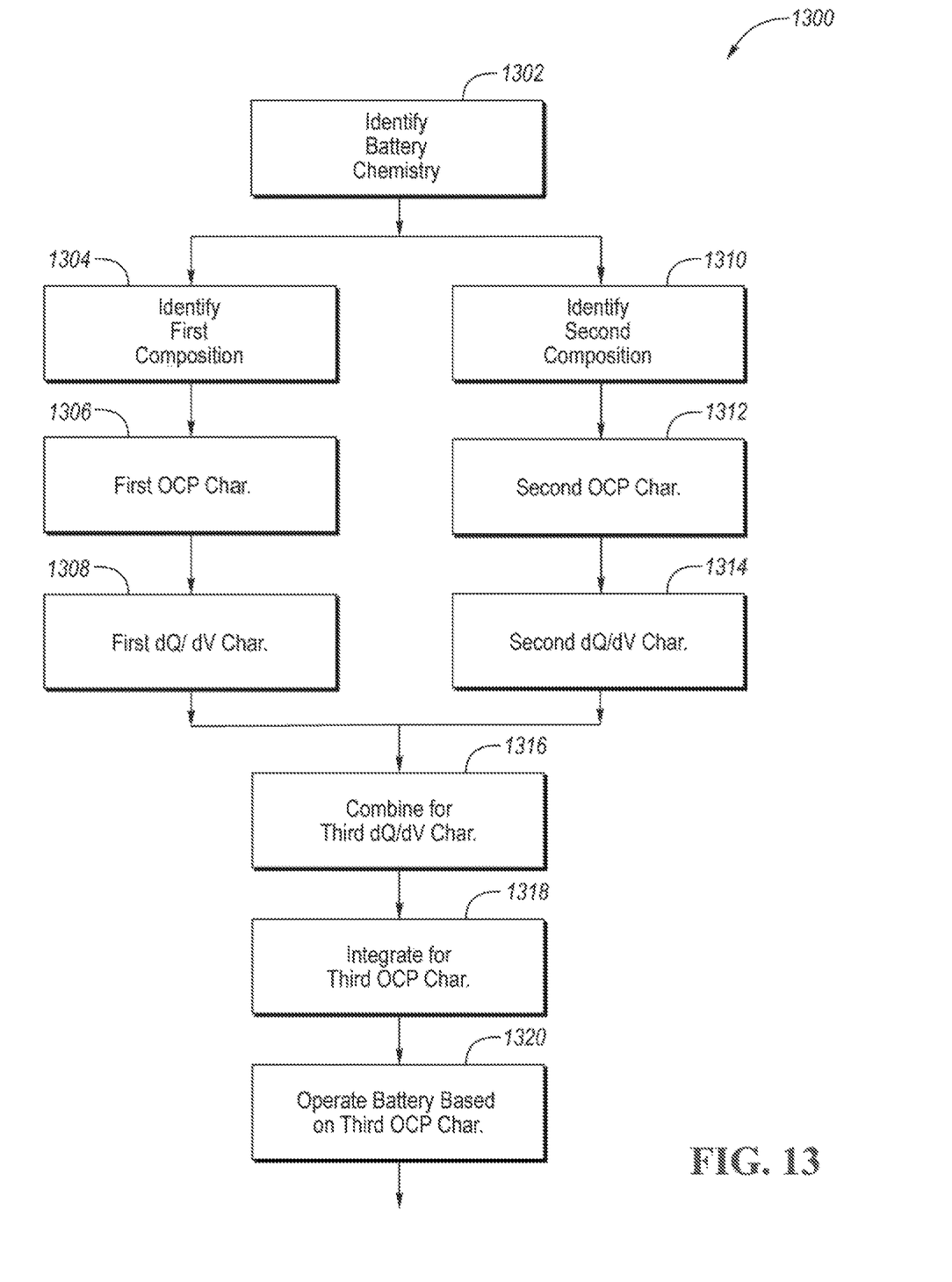
FIG. 13 depicts an example flow chart for generating battery characteristics.

FIG. 13 depicts a flow chart 1300 for a possible sequence of operations for implementing the method. The operations may be implemented in one or more controllers that are programmed to implement the operations. At operation 1302, the battery chemistry may be identified or selected. At this step, the set of predetermined elements for forming the cathode may be selected or identified. The set of elements may be as described above. At operation 1304, a first composition may be identified having a first combination of the elements. The first composition may be a lower edge composition that defines a proportion of a first element below which the 4.2V feature disappears. The first composition may include a minimum proportion of a first element and a maximum proportion of a second element.

At operation 1306, a first OCP characteristic may be generated corresponding to the first composition. The first OCP characteristic may define a voltage (V) as a function of capacity (Q) of the battery constructed using the first composition. The first OCP characteristic may be derived from testing or published results. At operation 1308, the first OCP characteristic may be converted to a first dQ/dV characteristic by taking the derivative of the first OCP characteristic.

At operation 1310, a second composition may be identified having a second combination of the elements. The second composition may be an upper edge composition that is defined such that a proportion of the second element is zero. The second composition may include a maximum proportion of the first element and a minimum proportion of the second element.

At operation 1312, a second OCP characteristic may be generated corresponding to the second composition. The second OCP characteristic may define a voltage (V) as a function of capacity (Q) of the battery constructed using the second composition. The second OCP characteristic may be derived from testing or published results. At operation 1314, the second OCP characteristic may be converted to a second dQ/dV characteristic by taking the derivative of the second OCP characteristic. Note that operations 1304-1308 may be performed in parallel with operation 1310-1314.

At operation 1316, the first and second dQ/dV characteristics may be combined, resulting in a third dQ/dV characteristic that corresponds to a target composition. The third dQ/dV characteristic may be generated by summing a first proportion of the first dQ/dV characteristic and a second proportion of the second dQ/dV characteristic. The first proportion may be defined by a target proportion of the first element that is present in the target composition. The first proportion and the second proportion sum to one. A range may be defined by a first difference between an upper proportion of the first element that is present in the second composition and a lower proportion of the first element that is present in the first composition and, the first proportion may be defined by dividing a second difference between the target proportion and the lower proportion by the range.

At operation 1318, the third dQ/dV characteristic may be integrated to derive a third OCP characteristic that corresponds to the target composition. The third OCP characteristic may be output to a battery management system.

At operation 1320, a battery constructed using the target composition may be operated according to the third OCP characteristic. Operating the battery may include charging and discharging the battery. Operating the battery may further include generate battery parameters associated with the battery such as state of charge, capacity, charge power limits, discharge power limits, and battery age estimates.

The methods described provide advantages in that battery characteristics may be predicted prior to constructing the battery. The methods can use previously generated battery characteristics to derive characteristics for batteries having similar chemical compositions. When incorporated into a battery management system, the system can autonomously generate battery characteristics based on the known characteristics. This allows for great flexibility as the system can operate new battery types without extensive reprogramming or battery testing and characterization.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method comprising:
    identifying a set of predetermined elements, including a first element and a second element, for a cathode of a lithium-ion battery,
    identifying a first composition and a second composition of the set, the first composition and the second composition including different proportions of the first element and the second element;
    generating a first open-circuit potential (OCP) characteristic corresponding to the first composition and a second OCP characteristic corresponding to the second composition, wherein each of the OCP characteristics defines a voltage (V) as a function of capacity (Q) of the lithium-ion battery;
    converting the first OCP characteristic to a first dQ/dV characteristic and the second OCP characteristic to a second dQ/dV characteristic;
    identifying a third composition of the set having a predetermined proportion of the first element;
    generating a third dQ/dV characteristic for the third composition by summing a first proportion of the first dQ/dV characteristic and a second proportion of the second dQ/dV characteristic, wherein the first proportion is defined by the predetermined proportion, and the first proportion and the second proportion sum to one;
    integrating the third dQ/dV characteristic to generate a third OCP characteristic corresponding to the third composition; and
    charging and discharging a battery comprised of the third composition using the third OCP characteristic.

2. The method of claim 1, wherein the first composition includes a minimum proportion of the first element and a maximum proportion of the second element.

3. The method of claim 1, wherein the second composition includes a minimum proportion of the second element and a maximum proportion of the first element.

4. The method of claim 1, wherein the set of predetermined elements includes at least two different transition metal oxide components such that oxidation/reduction coulumbs in a lithiation/delithiation characteristic are proportional to a corresponding stoichiometric composition and a potential at which oxidation/reduction processes occur are approximately equal within a class of materials that include the at least two different transition metal oxide components.

5. The method of claim 1, wherein a range is defined by a first difference between an upper proportion of the first element that is present in the second composition and a lower proportion of the first element that is present in the first composition and, the first proportion is defined by dividing a second difference between the predetermined proportion and the lower proportion by the range.

6. The method of claim 1, wherein the first OCP characteristic and the second OCP characteristic are approximated by averaging a lithiation characteristic and a delithiation characteristic corresponding to each of the first composition and the second composition.

7. The method of claim 1, wherein the set of predetermined elements includes Li, Ni, Co, M1, and O where M1 corresponds to a transition metal, and the first element is Ni, and the second element is Co.

8. The method of claim 1, wherein the set of predetermined elements includes Li, Ni, O and M1, where M1 is one of Al, Mn, or Mg, and the first element is Ni and the second element is M1.

9. The method of claim 1, wherein the set of predetermined elements includes Li, O, M1, and M2, wherein M1 and M2 are different transition metal oxide components.

10. A battery management system comprising:
   a memory for storing a plurality of characteristics corresponding to a plurality of compositions for a cathode of a battery; and
   a controller programmed to, responsive to receiving parameters for a target composition, (i) identify a class of compositions to which the target composition belongs, (ii) retrieve from the memory a first characteristic corresponding to a first composition and a second characteristic corresponding to a second composition such that the first composition and the second composition belong to the class, (iii) generate an open-circuit potential (OCP) characteristic for the target composition by summing a first proportion of the first characteristic and a second proportion of the second characteristic, wherein the first proportion is defined by a target proportion of a first element present in the target composition, and (iv) charging and discharging the battery according to the OCP characteristic.

11. The battery management system of claim 10, wherein the target proportion is between a first edge proportion that defines a proportion of the first element in the first composition and a second edge proportion that defines the proportion of the first element in the second composition.

12. The battery management system of claim 10, wherein the first composition and the second composition include the first element and a second element, and wherein the first composition includes a maximum proportion of the first element and a minimum proportion of the second element.

13. The battery management system of claim 10, wherein the first characteristic is a first composition OCP characteristic and the second characteristic is a second composition OCP characteristic.

14. The battery management system of claim 10, wherein the first characteristic is a dQ/dV characteristic of the first composition and the second characteristic is a dQ/dV characteristic of the second composition.

15. The battery management system of claim 14, wherein generating the OCP characteristic for the target composition further includes integrating a dQ/dV characteristic that results from summing a first proportion of the first characteristic and a second proportion of the second characteristic.

16. A method comprising:
   identifying a lower edge composition, including first and second transition metal components, for a cathode of a battery that defines a proportion of the first transition metal below which a 4.2V feature is not present;
   identifying an upper edge composition in which a proportion of the second transition metal is zero;
   generating a first open-circuit potential (OCP) characteristic for the lower edge composition and a second OCP characteristic for the upper edge composition;
   converting the first OCP characteristic to a first dQ/dV characteristic and the second OCP characteristic to a second dQ/dV characteristic;
   identifying a third composition having a predetermined proportion of the first transition metal;
   generating a third dQ/dV characteristic for the third composition by summing a first proportion of the first dQ/dV characteristic and a second proportion of the second dQ/dV characteristic, wherein the first proportion is defined by the predetermined proportion and the first proportion and the second proportion sum to one;
   integrating the third dQ/dV characteristic to generate a third OCP characteristic corresponding to the third composition; and
   outputting the third OCP characteristic to a battery management system for charging and discharging the battery comprised of the third composition.

17. The method of claim 16, wherein a range is defined by a difference between an upper proportion of the first transition metal that is present in the upper edge composition and a lower proportion of the first transition metal that is present in the lower edge composition and, the first proportion is defined by dividing a difference between the predetermined proportion and the lower proportion by the range.

18. The method of claim 16, wherein the first and second transition metal components are such that oxidation/reduction coulumbs in a lithiation/delithiation characteristic are proportional to a corresponding stoichiometric composition and a potential at which oxidation/reduction processes occur are approximately equal.

19. The method of claim 16, wherein the 4.2V feature is defined as a dQ/dV peak that exceeds a predetermined threshold.

20. The method of claim 16, wherein the first transition metal is nickel (Ni) and the second transition metal is cobalt (Co).

* * * * *

UNITED STATES PATENT AND TRADEMARK OFFICE
CERTIFICATE OF CORRECTION

| | |
|---|---|
| PATENT NO. | : 11,152,651 B2 |
| APPLICATION NO. | : 16/697388 |
| DATED | : October 19, 2021 |
| INVENTOR(S) | : Yelena Gorlin et al. |

It is certified that error appears in the above-identified patent and that said Letters Patent is hereby corrected as shown below:

In the Claims

Column 14, Lines 37-38, Claim 1:
After "for a cathode of a lithium-ion"
Delete "battery,"
Insert -- battery; --.

Signed and Sealed this
Twenty-first Day of March, 2023

Katherine Kelly Vidal
*Director of the United States Patent and Trademark Office*